(12) United States Patent
Zhang et al.

(10) Patent No.: US 10,979,608 B2
(45) Date of Patent: Apr. 13, 2021

(54) GHOSTING PROOF IMAGING DEVICE AND METHOD FOR MANUFACTURING SAME

(71) Applicant: TRIPLE WIN TECHNOLOGY(SHENZHEN) CO.LTD., Shenzhen (CN)

(72) Inventors: Long-Fei Zhang, Guangdong (CN); Shin-Wen Chen, New Taipei (TW); Kun Li, Guangdong (CN); Xiao-Mei Ma, Guangdong (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 45 days.

(21) Appl. No.: 16/250,172

(22) Filed: Jan. 17, 2019

(65) Prior Publication Data

US 2020/0007723 A1    Jan. 2, 2020

(30) Foreign Application Priority Data

Jun. 27, 2018   (CN) .......................... 201810682493.X

(51) Int. Cl.
*H04N 5/225* (2006.01)
*H05K 1/18* (2006.01)

(52) U.S. Cl.
CPC ......... *H04N 5/2254* (2013.01); *H04N 5/2253* (2013.01); *H05K 1/181* (2013.01); *H05K 2201/10121* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 7,813,043 B2* | 10/2010 | Lusinchi | H04N 5/2254 359/619 |
| 2006/0243884 A1* | 11/2006 | Onodera | H04N 5/2253 250/208.1 |
| 2007/0047109 A1* | 3/2007 | Shibata | H04N 5/2254 359/819 |
| 2007/0284511 A1* | 12/2007 | Toyoda | H04N 5/2257 250/208.1 |
| 2008/0316623 A1* | 12/2008 | Aoki | G02B 13/001 359/823 |

(Continued)

FOREIGN PATENT DOCUMENTS

| | | |
|---|---|---|
| CN | 101634738 A | 1/2010 |
| CN | 102902137 A | 1/2013 |

(Continued)

*Primary Examiner* — Twyler L Haskins
*Assistant Examiner* — Dwight Alex C Tejano
(74) *Attorney, Agent, or Firm* — ScienBiziP, P.C.

(57) ABSTRACT

An imaging device proofed against ghosting and flaring in captured images includes a lens barrel and a lens module received in the lens barrel. The lens barrel comprises an inner surface and a supporting portion extending radially from the inner wall surface. The supporting portion has through hole for light entry, the through hole comprises a reflecting surface, the supporting portion comprises a top surface and a bottom surface, the reflecting surface connects the top surface and the bottom surface, and a plurality of light-scattering structures are formed on the reflecting surface.

7 Claims, 7 Drawing Sheets

(56) References Cited

U.S. PATENT DOCUMENTS

| | | | | |
|---|---|---|---|---|
| 2010/0039713 A1* | 2/2010 | Lusinchi | ............. | G02B 13/001 |
| | | | | 359/819 |
| 2010/0045846 A1* | 2/2010 | Nishizawa | ........ | H01L 27/14618 |
| | | | | 348/340 |
| 2016/0011415 A1* | 1/2016 | Takada | ................... | G02B 1/111 |
| | | | | 348/148 |
| 2017/0285336 A1* | 10/2017 | Kasuga | ................... | G02B 7/09 |
| 2018/0299323 A1 | 10/2018 | Wan | | |

FOREIGN PATENT DOCUMENTS

| | | |
|---|---|---|
| CN | 104980638 | 10/2015 |
| CN | 105100556 | 11/2015 |
| CN | 206671643 U | 11/2017 |
| CN | 108172588 A | 6/2018 |
| TW | 335164 | 6/1998 |

\* cited by examiner

GHOSTING PROOF IMAGING DEVICE AND METHOD FOR MANUFACTURING SAME

FIELD

The subject matter herein generally relates to image capturing devices.

BACKGROUND

Camera modules are used in digital cameras and mobile phones. A camera module usually includes a lens bracket and a lens module fixed on the lens bracket. During image capturing by the camera module, light on the lens module can be reflected by the lens bracket before reaching the image sensor of the camera module, thus forming a ghost or flare and degrading the quality of the captured image.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
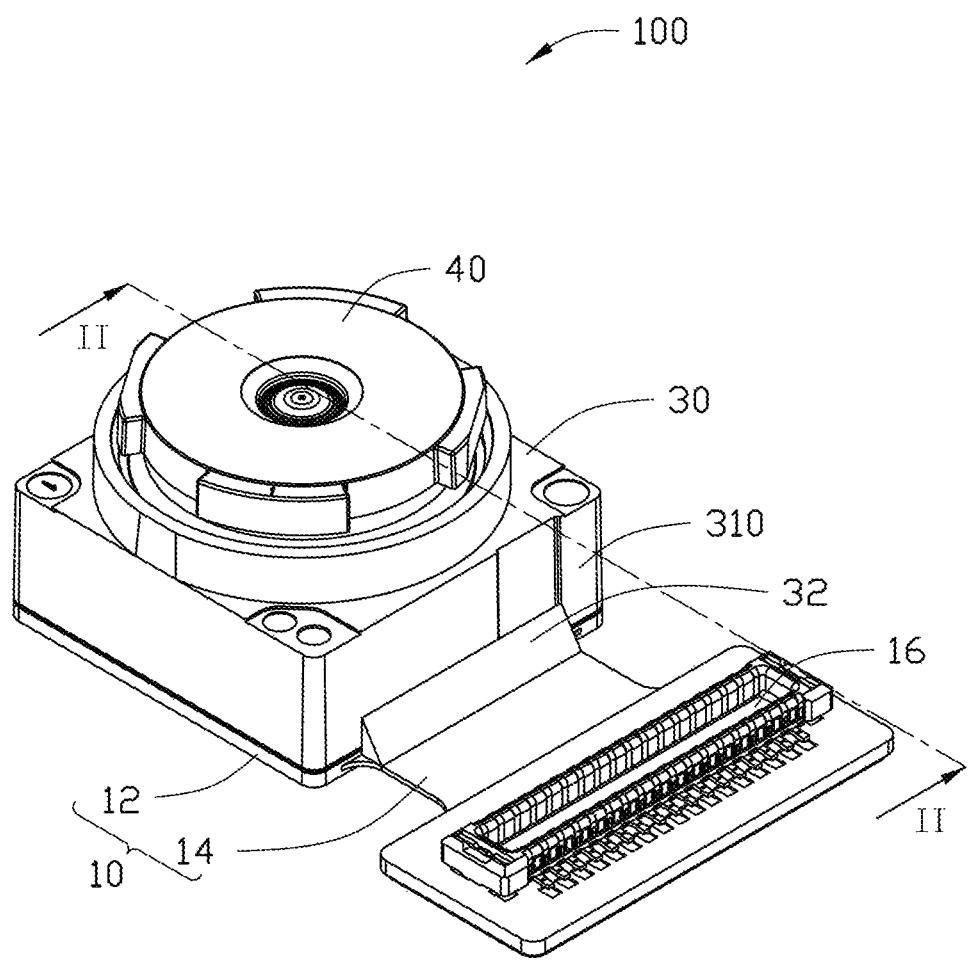
FIG. 1 is an isometric view of an imaging device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
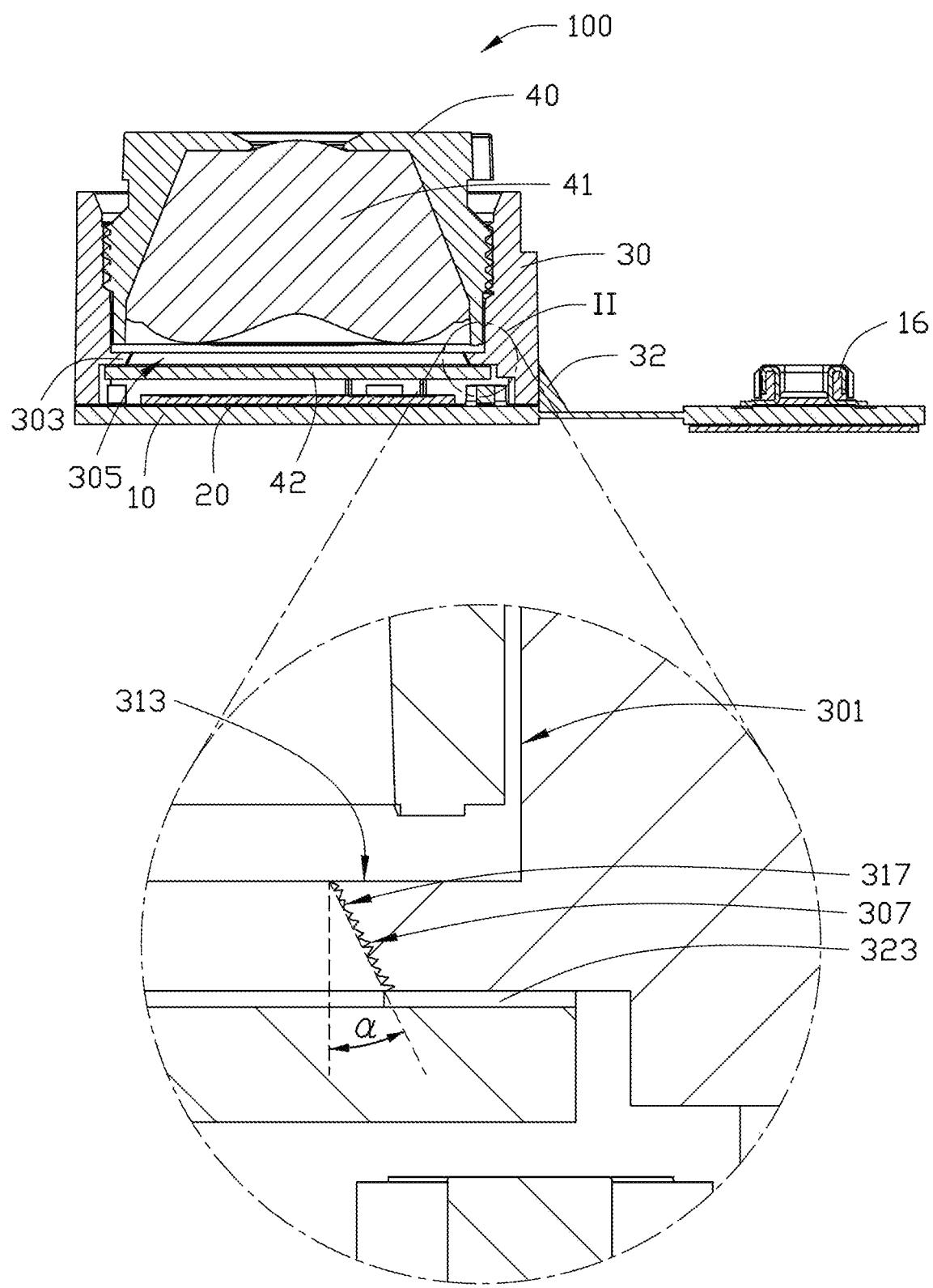
FIG. 2 is a cross-sectional view along line II-II of the imaging device in FIG. 1, with an enlarged view of circled area II.

FIGS. 1-2 illustrate an imaging device 100 according to one embodiment. The imaging device 100 includes a printed circuit board 10, an image sensor 20, a lens barrel 30, and a lens module 40 received in the lens barrel 30.

The printed circuit board 10 can be a flexible circuit board, a ceramic board, or a rigid-flexible circuit board. In the illustrated embodiment, the printed circuit board 10 is a rigid-flexible circuit board.

The printed circuit board 10 includes a first portion 12 and a second portion 14 connected with the first portion 12. The second portion 12 is provided with a connector 16.

The image sensor 20 is mounted on a central area of the first portion 12 of the printed circuit board 10 and electrically connected to the printed circuit board 10.

The lens barrel 30 is fixed on the first portion 12 via an adhesive. The adhesive after application includes a side adhesive portion 32. The side adhesive portion 32 is on the second portion 14 of the printed circuit board 10 and bonds to one side surface of the lens barrel 30. The side adhesive portion 32 is substantially, in section, a triangular prism. Two surfaces of the side adhesive portion 32 bond to the side surface 310 of the lens barrel 30 and the second portion 14 to secure the lens barrel 30 on the printed circuit board 10.

The lens barrel 30 is fixed on the first portion 12 of the printed circuit board 10. The lens barrel 30 includes an inner surface 301 and a supporting portion 303 extending radially from the inner wall surface 301, the supporting portion 303 is configured for bearing a filter sheet 42 of the lens module 40. The filter sheet 42 is configured to protect the image sensor 20, and to prevent dust and fragments falling on the image sensor 20. The supporting portion 303 divides the lens barrel 30 into two parts: the upper part for receiving the lens module 40, and the lower part which covers the image sensor 20.

The lens module 40 can be a fixed-focus camera module or a zoom camera module. A fixed-focus camera module means that the focal length is not adjustable. The focal length of a zoom camera module can be adjusted, and the user can adjust the focus by adjusting its focal length when using the imaging device 100. The lens module 40 may include one or more lenses 41. The lens module 40 is received in the lens barrel 30. In the embodiment, the lens module 40 is mated with the lens barrel 30 by a thread. In other embodiments, the lens module 40 is received in the lens barrel 30 by clamping or directly fixed by glue.

The supporting portion 303 is provided with a light through hole 305 to permit entry of light. The light through hole 305 includes a reflecting surface 307, sections of which can be non-planar. The supporting portion 303 includes a top surface 313, a bottom surface 323 opposite and parallel to the top surface 313. The reflecting surface 307 connects the top surface 313 and the bottom surface 323. A plurality of light-scattering structures 317 is formed on the reflecting surface 307. The light-scattering structures 317 are irregular. Sizes and shapes of the light-scattering structures 317 are variedly, so that the reflecting surface 307 is a fogged surface, and light beams incident on the reflecting surface 307 form a diffused reflection.

The scattering structure 317 is formed by plasma etching, to avoid forming particles, and so as not to damage the filter sheet 42. In the embodiment, the reflecting surface 307 is inclined. The reflecting surface 307 tilts in a direction oriented towards the image sensor 20. An angle α between the reflecting surface 307 and a vertical direction is greater than 0 degrees and less than or equal to 65 degrees.

The angle α being designed in this range, the supporting portion 303 is thus easily machined, and difficulty in forming a sharp angle of the supporting portion 303 is avoided. Angle α being in this range also means that light beams incident on the reflecting surface 307 is then able to be reflected to the outside or to the periphery of the photosensitive region of the image sensor 20, rather than being received on a sensitive area of the image sensor 20. That is, light beams from the reflecting surface 307 strayed into the image sensor 20 is reduced. The light-scattering structures 317 formed on the reflecting surface 307 can also reduce an intensity of the light beams incident on the image sensor 20. As a result, glare in the captured image is reduced and the imaging quality of the camera module 100 is improved.

Figure 3:
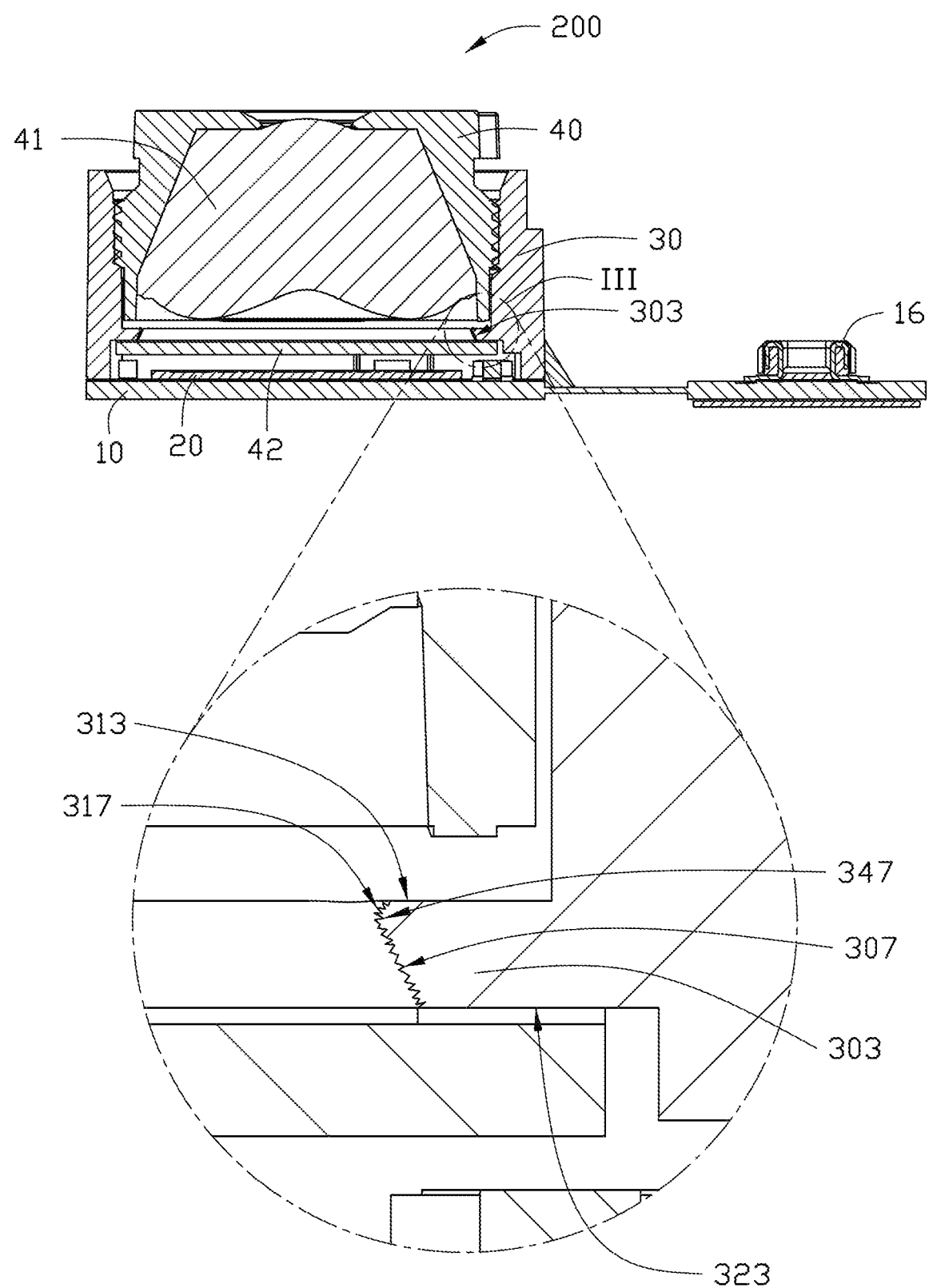
FIG. 3 is another cross-sectional view of an imaging device in accordance with one embodiment, with enlarged view of circled area III.

FIG. 3 shows an imaging device 200 according to another embodiment. The imaging device 200 in FIG. 3 is similar to the imaging device 100 in FIG. 2. The imaging device 200 also includes a printed circuit board 10, an image sensor 20, a lens barrel 40, and a lens module 50. The difference between the imaging device 200 and the imaging device 100 in FIG. 2 is that the supporting portion 303 further includes an arced surface 347. The arced surface 347 is formed between the reflecting surface 307 and the top surface 313, and the arced surface 347 is also formed with a plurality of light-scattering structures 317.

The arced surface 347 reduces difficulty in forming the supporting portion 303, because the supporting portion 303 with a sharp angle is inclined to collect bubble therein. The irregular light-scattering structures 317 formed on the arced surface 347 also ensure the imaging quality, the arced surface 347 prevents or reduces light from reflecting onto the image sensor 20.

Figure 4:
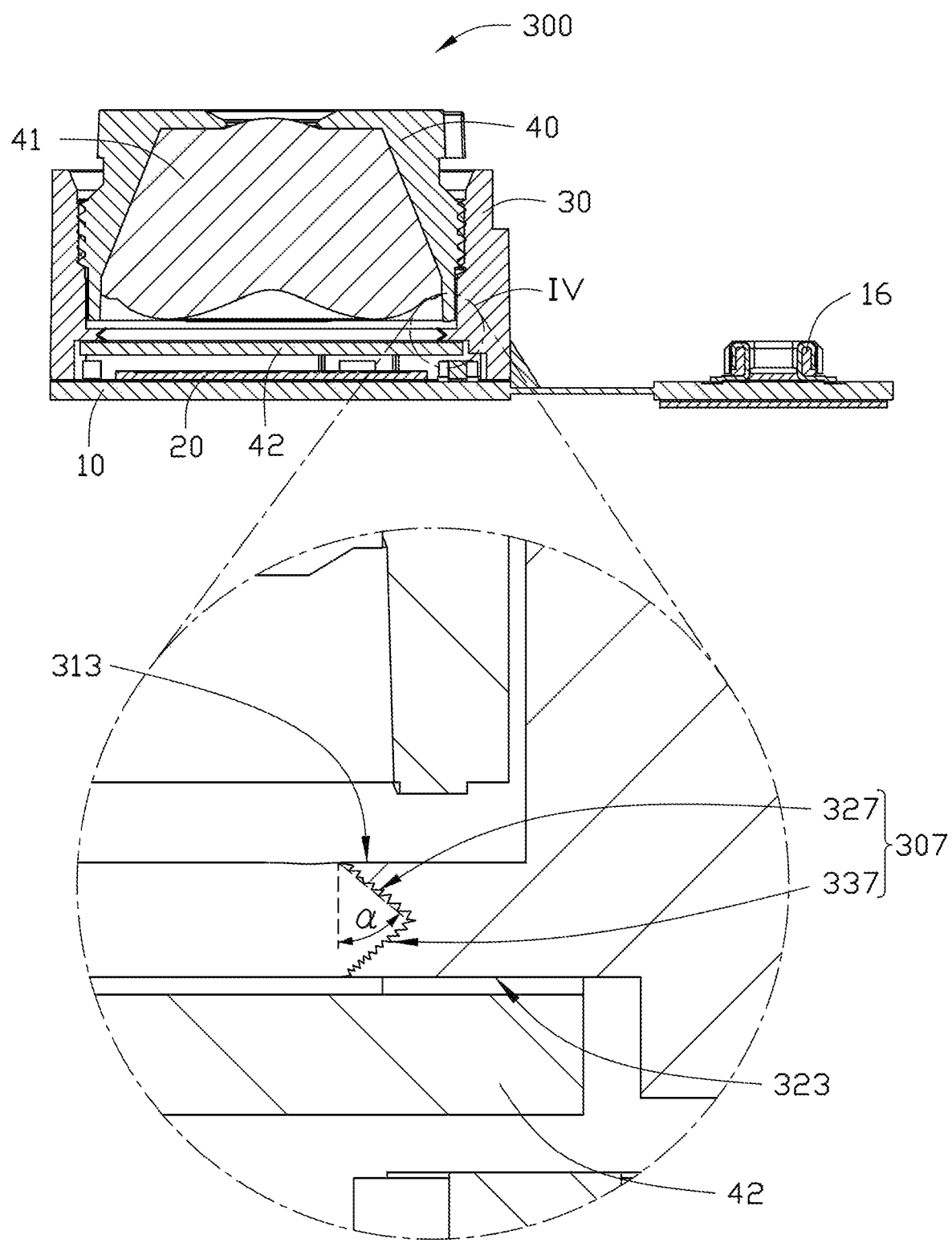
FIG. 4 is a cross-sectional view of an imaging device in accordance with one embodiment, with enlarged view of circled area IV.

FIG. 4 shows an imaging device 300 according to another embodiment. The imaging device 300 in FIG. 4 is similar to the imaging device 100 in FIG. 2. The imaging device 300 also includes a printed circuit board 10, an image sensor 20, a lens barrel 40, and a lens module 50. The difference between the imaging device 300 and the imaging device 100 in FIG. 2 is that the reflecting surface 307 includes a first connecting surface 327 connected to the top surface 313 and a second connecting surface 337 connected to the first connecting surface 327.

The first connecting surface 327 and the second connecting surface 337 are inclined surfaces. A tilt direction of the first connecting surface 327 is oriented towards the printed circuit board 10, and a tilt direction of the second connecting surface 337 is oriented towards the lens module 40. The light-scattering structures 317 are formed on the first connecting surface 327 and the second connecting surface 337. An angle between the first connecting surface 327 and a vertical direction is greater than 0 degrees and less than or equal to 65 degrees. An angle between the second connecting surface 337 and a vertical direction is greater than 0 degrees and less than or equal to 65 degrees. Tilt direction of the first connecting surface 327 is oriented towards the image sensor 20, and light beams incident to the first connecting surface 327, and being reflected to the image sensor 20, are thereby reduced. When light beams incident on the second connecting surface 337, the light beams are scattered by the light-scattering structures 317 formed on the first connecting surface 327 and the second connecting surface 337, and intensity of the beams is reduced. That is, the first connecting surface 327 and the second connecting surface 337 can reflect and scatter a portion of the light from the incident surface, thus reducing the chances of stray light beams being incident to the image sensor 20. As a result, glare is reduced and the imaging quality of camera module 100 is improved.

Figure 5:
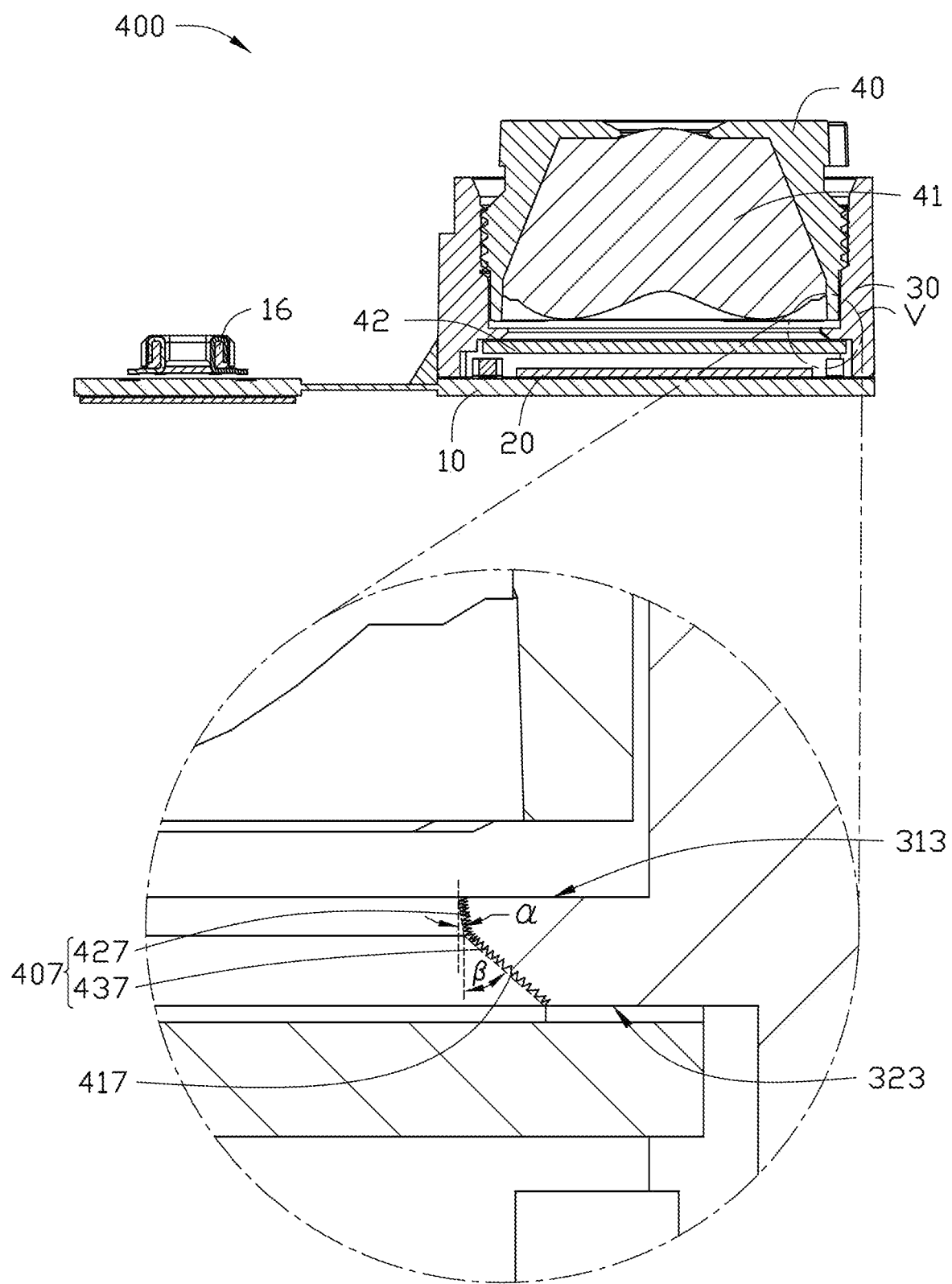
FIG. 5 is a cross-sectional view of an imaging device in accordance with one embodiment, with enlarged view of circled area V.

FIG. 5 shows an imaging device 400 according to another embodiment. The imaging device 400 in FIG. 5 is similar to the imaging device 100 in FIG. 2. The imaging device 400 also includes a printed circuit board 10, an image sensor 20, a lens barrel 40, and a lens module 50. The difference between the imaging device 400 and the imaging device 100 in FIG. 2 is that the reflecting surface 407 includes a first connecting surface 427 connected to the top surface 313 and a second connecting surface 437 connecting the first connecting surface 427 and the bottom surface 423. The first connecting surface 427 and the second connecting surface 437 are tilted toward the printed circuit board 10. An angle α between the first connecting surface 427 and a vertical direction is in a range between 0 and 10 degrees, and an angle β between the second connecting surface 437 and a vertical direction is in a range between 0 and 65 degrees.

The reflecting surface 407 meets the function requirements and avoids difficulties in being formed. Furthermore, the reflecting surface 407 is designed to be a two-stage structure, such as the first connecting surface 427 and the second connecting surface 437, so that the light beams incident on the reflecting surface 407 are reflected at different angles, thereby reducing intensity of light beams reflected on the image sensor 20 from one direction. The light-scattering structures 417 on the first connecting surface 427 and the second connecting surface 437 diffuse light beams reaching the reflecting surface 407, and the intensity of the light reflected onto the image sensor 20 can also be significantly reduced, and glare caused by stray light is avoided.

Figure 6:
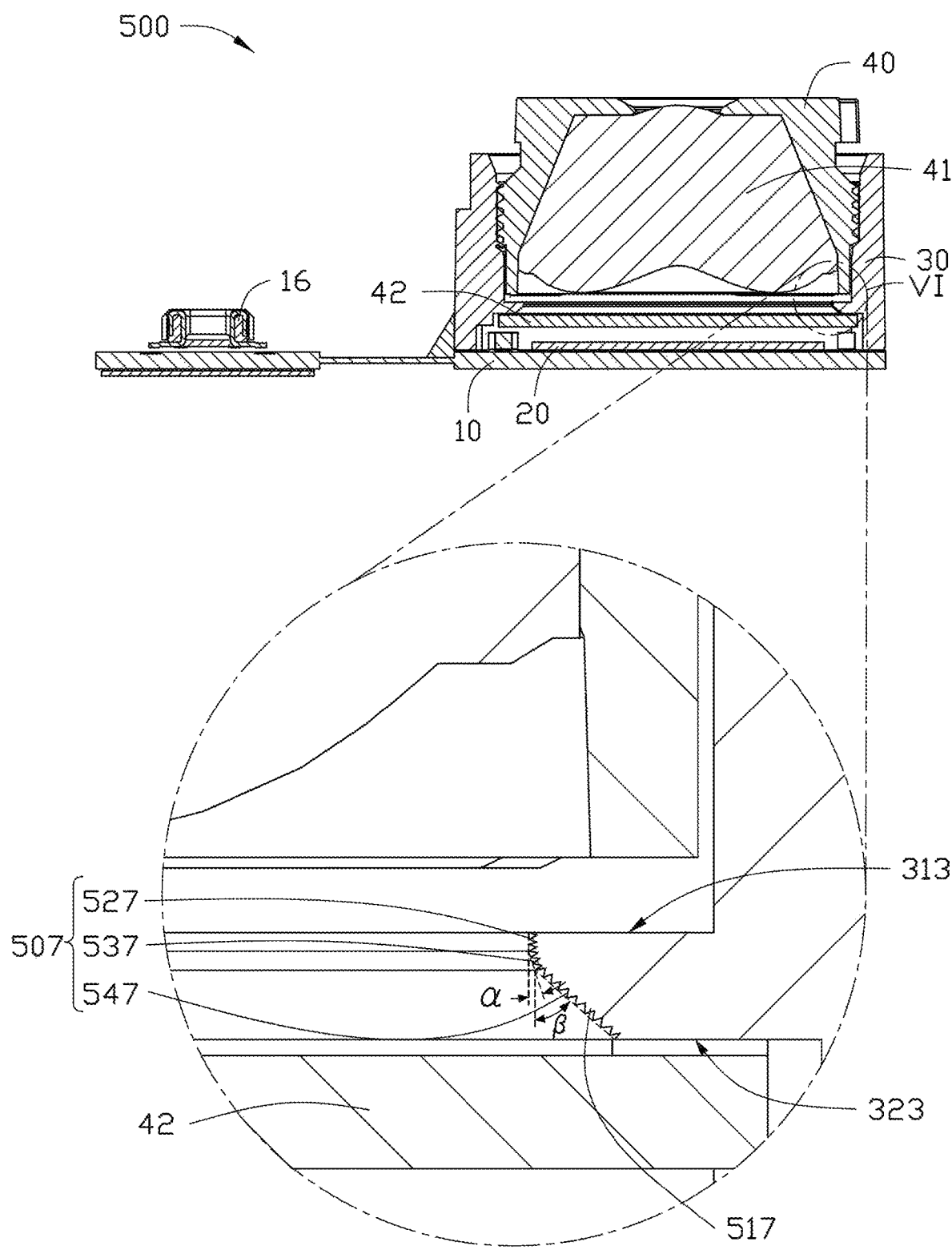
FIG. 6 is a cross-sectional view of an imaging device in accordance with one embodiment, with an enlarged view of circled area VI.

FIG. 6 shows an imaging device 500 according to another embodiment. The imaging device 500 in FIG. 6 is similar to the imaging device 100 in FIG. 2. The imaging device 500 also includes a printed circuit board 10, an image sensor 20, a lens barrel 40, and a lens module 50. The difference between the imaging device 500 and the imaging device 100 in FIG. 2 is that the reflecting surface 507 includes a first connecting surface 527 connected to the top surface 313, a second connecting surface 537 connecting to the first connecting surface 527, and a third connecting surface 547 connecting to the bottom surface 323. The first connecting surface 527 is perpendicular to the top surface 313, the second connecting surface 537 and the third connecting surface 547 are tilted toward the printed circuit board 10. An angle α between the second connecting surface 537 and the first connecting surface 527 is in a range between 0 and 10 degrees, and an angle β between the third connecting surface 547 and a vertical direction is in a range between 0 and 65 degrees.

The reflecting surface 507 avoids the forming difficulties. Furthermore, the reflecting surface 507 is designed to be a three-stage structure, such as the first connecting surface 527, the second connecting surface 537, and the third connecting surface 547, so that the light beams incident on the reflecting surface 507 are reflected at different angles. Again, the intensity of light beams reflected onto the image sensor 20 from a single direction is reduced. The light-scattering structures 517 on the first connecting surface 527, the second connecting surface 537, and the third connecting surface 547, diffuse light beams reaching the reflecting surface 507, and the intensity of the light reflected on the image sensor 20 can also be significantly reduced, and glare caused by stray light is also avoid.

Figure 7:
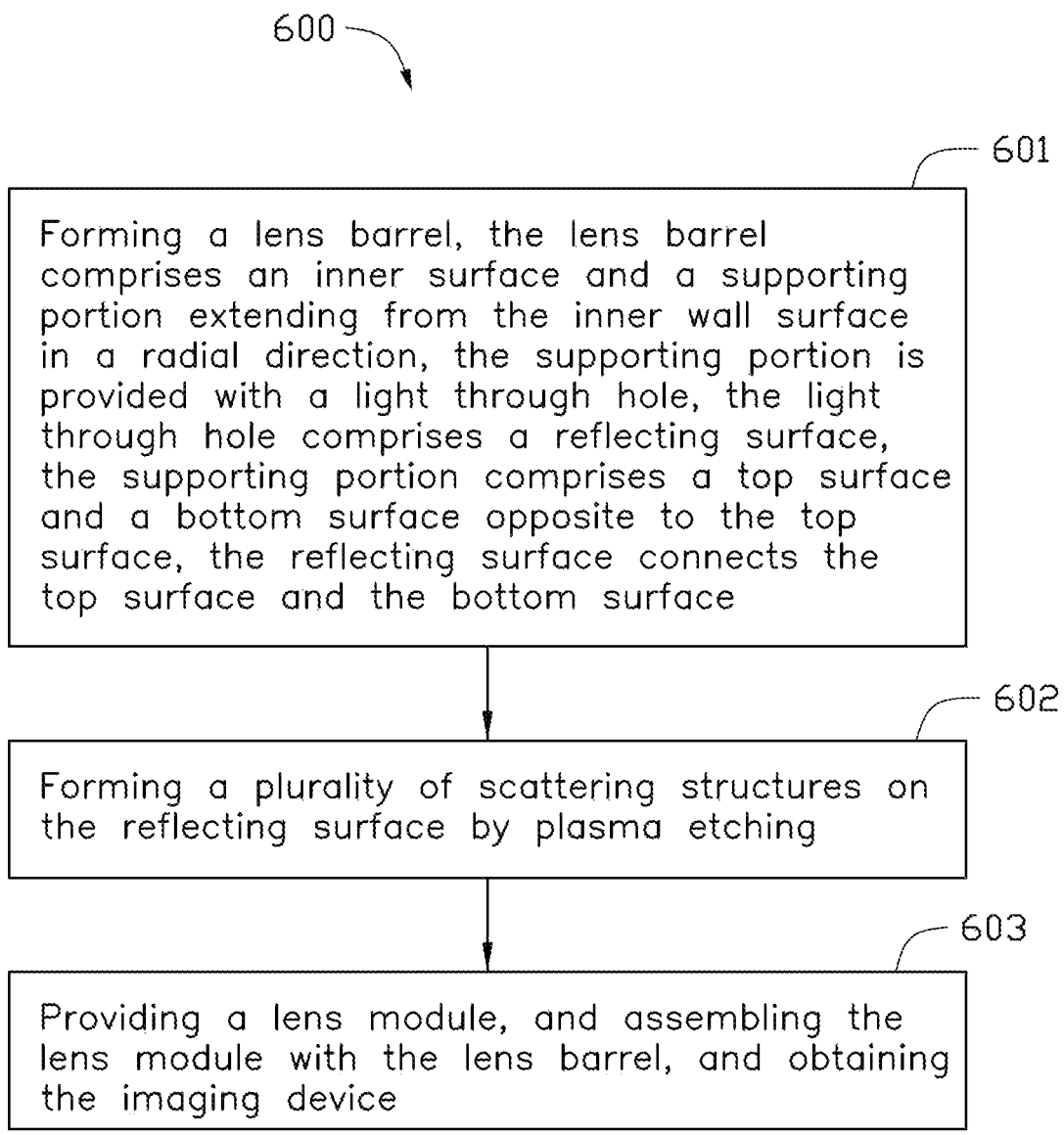
FIG. 7 is a flowchart of a manufacturing method for the imaging device in FIG. 1.

FIG. 7 illustrates a method for manufacturing the imaging device 100 according to one embodiment. The method 600 is provided by way of embodiment as there are a variety of ways to carry out the method. The method 600 can begin at block 601.

At block 601, a lens barrel 30 is formed. The lens barrel 30 comprises an inner surface 301 and a supporting portion 303 extending radially from the inner wall surface 301, the supporting portion 303 is provided with a light through hole 305, the light through hole 305 comprises a reflecting surface 307, the supporting portion 303 comprises a top surface 313 and a bottom surface 323 opposite to the top surface 313, the reflecting surface 307 connects the top surface 313 and the bottom surface 323.

At block 602, a plurality of light-scattering structures 317 are formed on the reflecting surface 307 by plasma etching, to avoid forming particles.

At block 603, a lens module 40 is provided, and the lens module 30 is assembled with the lens barrel 30, and the imaging device 100 is obtained.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An imaging device comprising:
a lens barrel; and a lens module received in the lens barrel, the lens barrel comprising an inner surface and a supporting portion extending radially from the inner wall surface, the supporting portion comprising a light through hole comprising a reflecting surface, the supporting portion comprising a top surface and a bottom surface, the reflecting surface connecting the top surface and the bottom surface and comprising a plurality of light-scattering structures thereon;
wherein the reflecting surface comprises a first connecting surface connected to the top surface and a second connecting surface connected to the first connecting surface, the first connecting surface and the second connecting surface are inclined surfaces relative to an optical axis of the imaging device;
wherein an angle between the first connecting surface and a vertical direction is greater than 0 degrees and less than or equal to 65 degrees, an angle between the second connecting surface and a vertical direction is greater than 0 degrees and less than or equal to 65 degrees;
wherein the light-scattering structures are irregularly sized and shaped;
wherein the imaging device further comprises a printed circuit board, the printed circuit board comprises a first portion and a second portion connected with the first portion, the lens barrel is fixed on the first portion, and the second portion comprises a connector;
wherein a tilt direction of the first connecting surface is oriented towards the printed circuit board, and a tilt direction of the second connecting surface is oriented to the lens module.

2. The imaging device of claim 1, further comprising an image sensor mounted on the first portion of the printed circuit board, wherein the lens barrel covers the image sensor.

3. The imaging device of claim 1, wherein the top surface is parallel to the bottom surface.

4. The imaging device of claim 1, wherein the supporting portion further comprises an arced surface, the arced surface connects the reflecting surface and the top surface, and the arc surface comprises a plurality of light-scattering structures thereon.

5. The imaging device of claim 1, wherein the lens module further comprises a filter sheet, and the filter sheet is fixed on the bottom surface.

6. A method for manufacturing an imaging device, comprising:
forming a lens barrel comprising an inner surface and a supporting portion extending radially from the inner wall surface, forming a light through hole in the supporting portion, wherein the light through hole comprises a reflecting surface, the supporting portion comprises a top surface and a bottom surface opposite to the top surface, the reflecting surface connects the top surface and the bottom surface, wherein the reflecting surface comprises a first connecting surface connected to the top surface and a second connecting surface connected to the first connecting surface, the first connecting surface and the second connecting surface are inclined surfaces relative to an optical axis of the imaging device, wherein an angle between the first connecting surface and a vertical direction is greater than 0 degrees and less than or equal to 65 degrees, an angle between the second connecting surface and a vertical direction is greater than 0 degrees and less than or equal to 65 degrees;
forming a plurality of light-scattering structures on the reflecting surface by plasma etching; and
providing a lens module, and assembling the lens module with the lens barrel, thereby obtaining the imaging device;
wherein the light-scattering structures are irregularly sized and shaped;
wherein the imaging device further comprises a printed circuit board, the printed circuit board comprises a first portion and a second portion connected with the first portion, the lens barrel is fixed on the first portion, and the second portion comprises a connector;
wherein a tilt direction of the first connecting surface is oriented towards the printed circuit board, and a tilt direction of the second connecting surface is oriented to the lens module.

7. The method of claim 6, wherein the top surface is parallel to the bottom surface.

* * * * *